(12) United States Patent
Schlierf

(10) Patent No.: US 10,032,607 B2
(45) Date of Patent: Jul. 24, 2018

(54) FREQUENCY TUNING OF A RF-GENERATOR WITHIN A PLASMA PROCESS

(71) Applicant: COMET AG, Flamatt (CH)

(72) Inventor: Roland Schlierf, Köln (DE)

(73) Assignee: COMET AG (CH)

( * ) Notice: Subject to any disclaimer, the term of this patent is extended or adjusted under 35 U.S.C. 154(b) by 0 days.

(21) Appl. No.: 15/532,743

(22) PCT Filed: Dec. 3, 2015

(86) PCT No.: PCT/EP2015/078571
§ 371 (c)(1),
(2) Date: Jun. 2, 2017

(87) PCT Pub. No.: WO2016/087607
PCT Pub. Date: Jun. 9, 2016

(65) Prior Publication Data
US 2017/0345618 A1    Nov. 30, 2017

(30) Foreign Application Priority Data

Dec. 3, 2014   (EP) .................................... 14196158

(51) Int. Cl.
*H01J 7/24*    (2006.01)
*H01J 37/32*    (2006.01)

(52) U.S. Cl.
CPC .... *H01J 37/32165* (2013.01); *H01J 37/3299* (2013.01); *H01J 37/32183* (2013.01); *H01J 2237/327* (2013.01)

(58) Field of Classification Search
CPC ................................................ H01J 37/32165

USPC ..................................................... 315/111.21
See application file for complete search history.

(56) References Cited

U.S. PATENT DOCUMENTS

| | | | | |
|---|---|---|---|---|
| 5,892,198 | A * | 4/1999 | Barnes .............. | H01J 37/32082 219/121.43 |
| 6,020,794 | A * | 2/2000 | Wilbur ..................... | H05H 1/46 333/17.1 |
| 8,073,646 | B2 * | 12/2011 | Sato ................... | H01J 37/32082 118/712 |
| 9,408,288 | B2 * | 8/2016 | Valcore, Jr. ....... | H01J 37/32165 |
| 9,673,026 | B2 * | 6/2017 | Valcore, Jr. ....... | H01J 37/32165 |
| 2013/0006555 | A1 * | 1/2013 | Roberg ............. | H01J 37/32183 702/61 |
| 2013/0213934 | A1 | 8/2013 | Valcore, Jr. et al. | |

(Continued)

OTHER PUBLICATIONS

International Preliminary Report on Patentability for Application No. PCT/EP2015/078571 dated Jun. 6, 2017.

(Continued)

*Primary Examiner* — Thuy Vinh Tran
(74) *Attorney, Agent, or Firm* — Tarolli, Sundheim, Covell & Tummino LLP

(57) ABSTRACT

A method of frequency tuning an electrical generator for supplying electrical power to a plasma is provided. Also provided is a plasma processing system and a computer program product. The method, the electrical generator, the plasma processing system, and the computer program product may have the advantage that the stability of the plasma with respect to repeated and essentially identical high and low power pulses is used to reduce the controlling effort and to check the stability of the plasma process.

15 Claims, 5 Drawing Sheets

(56) References Cited

U.S. PATENT DOCUMENTS

| | | |
|---|---|---|
| 2013/0214683 A1 | 8/2013 | Valcore, Jr. et al. |
| 2014/0009073 A1 | 1/2014 | Valcore, Jr. et al. |
| 2014/0106572 A1 | 4/2014 | Xu et al. |
| 2017/0263419 A1* | 9/2017 | Valcore, Jr. ....... H01J 37/32165 |

OTHER PUBLICATIONS

International Search Report for Application No. PCT/EP2015/078571 dated Feb. 2, 2016.

* cited by examiner

FREQUENCY TUNING OF A RF-GENERATOR WITHIN A PLASMA PROCESS

RELATED APPLICATIONS

The present invention is a U.S. National Stage under 35 USC 371 patent application, claiming priority to Serial No. PCT/EP2015/078571, filed on 3 Dec. 2015; which claims priority from EP 14196158.1, filed on 3 Dec. 2014, the entirety of both of which are incorporated herein by reference.

FIELD OF THE INVENTION

The invention relates to a method of frequency tuning, a related electrical generator and plasma processing system and a corresponding computer program product.

BACKGROUND OF THE INVENTION

US 2009/0284156 A1 discloses methods of tuning a plasma process and corresponding apparatus which may include an RF power supply having frequency tuning and a matching network coupled to the RF power supply that share a common sensor for reading reflected RF power reflected back to the RF power supply and a common controller for tuning each of the RF power supply and the matching network.

The proposed methods and corresponding apparatus are complex.

SUMMARY OF THE INVENTION

It's thus an object according to a first aspect of the present invention to provide an improved method of frequency tuning a plasma process.

According to a first aspect a method of frequency tuning an electrical generator for supplying electrical power to a plasma is provided. The method comprises a pulsed mode, the pulse mode comprising at least a high power pulse comprising a high power level and a low power pulse comprising a low power level different to zero power. The pulse mode may comprise three four or more different power levels. The method comprises the steps of:
  providing RF-power with a high power starting frequency set comprising at least one high power starting frequency at the high power pulse with a predefined high power pulse shape;
  providing RF-power with a low power starting frequency set comprising at least one low power starting frequency at the low power pulse with a predefined low power pulse shape;
  determining a reflected high power at the high power starting frequency;
  tuning the high power starting frequency to a different first high power frequency of a first high power frequency set if the reflected high power exceeds a high power threshold value such that the reflected high power decreases below the high power threshold value;
  determining a reflected low power at the low power starting frequency;
  tuning the low power starting frequency to a different first low power frequency of a first low power frequency set if the reflected low power exceeds a low power threshold value such that the reflected low power decreases below the low power threshold value.

The method may, for example, be used in plasma processes which are used, for example, for manufacturing, deposition, etching or cleaning semiconductors.

The sequence of the method steps may not necessarily be arranged as given above. It may, for example be possible to perform the steps of determining the reflected low power and tuning the low power starting frequency prior to the steps of determining the reflected high power and tuning the high power starting frequency.

The frequency sets may comprise one or more frequencies which are used to adapt the impedance of the load to the impedance of the electrical generator within one power pulse. Each frequency set may therefore comprise a first frequency, a second frequency, a third frequency and so on. The high and low power starting frequency sets may, for example, comprise 1, 2, 3, 4 or more high and low power starting frequencies. The reflected high and low power may be determined by means of power measurements by coupling out a defined fraction of the reflected high and/or low power. Alternatively or in addition it may be possible to determine or measure the impedance of the plasma (time varying load) and calculate the reflected power by means of the difference between the impedance of the plasma and the electrical generator. The impedance of the electrical generator may be, for example, 50 Ohm. A matching network may be provided between the electrical generator and the plasma in order to transform the impedance of the generator to a target impedance at a predefined frequency. The impedance of the plasma may vary over time and depends, for example, on the power level, the chemical composition of the plasma, the density of the plasma and the like. The predefined frequencies at the different power levels may thus be different. The high power starting frequency set may thus comprise one or more high power starting frequencies which are different than the one or more low power starting frequencies in order to match the impedances at the different power levels. The high power starting frequencies and the low power starting frequencies of the respective frequency sets may be determined by means of a self learning process or by means of simulations taking into account the physical boundary conditions of the plasma. The high power starting frequencies and the low power starting frequencies of the respective frequency sets should be chosen such that the reflected power remains below the respective threshold value for as much pulses as possible at the respective power level.

The high and low power pulse shape may be square shaped. The high and low power pulse comprise in this case only one high and low power level. Alternatively, the high and low power pulse shape may comprise more complex pulses in which the power level varies at least slightly during the high and low power pulse.

The high or low power pulse comprises one period with the predefined high or low power pulse shape.

The reflected power may be determined at every pulse of the low or high power level or there may be a number of pulses between every determination of the reflected power.

It has been observed that the impedance of a plasma at the high and low power level remains stable within a time frame of several seconds or even minutes as long as there are no external influences as, for example, pressure changes. The pulse width of the pulses at the high and low power level is usually between 10 μs and 1 s. It's thus not necessary to determine the reflected power at the high or low power level at every pulse. It may be sufficient to perform the determination every 5, 10, 20, 50, 100 high or low power pulse. The number of power pulses between each determination of the reflected power (determination interval) may be adapted to the measured value of the reflected power at the high or low power pulse. The determination interval may be lower if the reflected high or low power is near to the high or low power threshold value.

The tuning process is described in the following for the high power level. The tuning process is similar for the low power level. The first high power starting frequency of the first high power starting frequency set is tuned to a different first high power frequency of a first high power frequency set if the reflected high power exceeds the high power threshold value. The high power threshold value may be an absolute power value or a ratio between the reflected high power and forward high power provided to the plasma. The value of the forward high power may be provided by the electrical generator or the forward high power may be measured by means of an external measurement device.

The reflected high power and the forward high power may be preferably measured in the same way in order to minimize systematic errors. The tuning process may be arranged such that the frequency is decreased or increased and the reflected high power is determined and compared with reflected high power determined at the previous frequency (e.g. high power starting frequency) used at the high power pulse. The frequency may, for example, be further increased if the reflected high power decreases if the frequency was increased in a previous step. The frequency may be increased if the reflected high power increases if the frequency was decreased in a previous step. The tuning process may end as soon as the reflected high power is below the high power threshold value. Alternatively, it may be that the tuning process ends as soon as the reflected high power is below the high power threshold value and further changes of the high power frequency do not decrease the reflected high power. The high power frequency with lowest reflected high power may be in this case chosen as first high power frequency of a first high power frequency set. The process of determining the reflected high power and tuning the high power frequency may be repeated during the plasma process such that the high power frequency changes as soon as the impedance of the plasma changes such that the reflected high power exceeds the high power threshold value. The process would start with the high power starting frequency set comprising the high power starting frequency followed by the first high power frequency set comprising the first high power frequency and further followed by further high power frequency sets comprising further high power frequencies until the plasma process is stopped. The last high power frequency of the last high power frequency set determined in the plasma process may be stored as new high power starting frequency of a new high power frequency set. The same or similar determination and tuning procedures may be used at the low power level.

It may be advantageous to use a tuning process in which the reflected high or low power is minimized. The latter may enable to increase the determination interval and thus to decrease the effort of determination and tuning. The decrease of the effort used to find the minimum reflected high or low power may be compared with the advantage of longer determination intervals. The tuning process may be a self learning process in which it may, for example, be determined based on previous tuning steps how many optimization steps may make sense.

The method may comprise the additional steps of:
determining the reflected high power at a first high power pulse of the high power level;
repeating determining the reflected high power at a subsequent high power pulse until the reflected high power exceeds the high power threshold value, wherein subsequent determinations of the reflected high power are performed at different high power pulses;
tuning the high power starting frequency if the reflected high power exceeds the high power threshold value;
determining the reflected low power at a first low power pulse of the low power level;
repeating determining the reflected low power at a subsequent low power pulse until the reflected low power exceeds the low power threshold value, wherein subsequent determinations of the reflected low power are performed at different low power pulses;
tuning the low power starting frequency if the reflected low power exceeds the low power threshold value.

The first high or low power pulse needs not necessarily to be the high or low power pulse which follows after ignition of the plasma. The number of high or low power pulse between ignition of the plasma and the first high or low power pulse may be, for example, the three, five, ten or more high or low power pulses. The number of high power pulses depends on the stability of the plasma process. Determination of the reflected high or low power at different high or low power pulses may have the advantage that less processing power is needed.

The step of tuning the high power starting frequency may comprise the steps of:
changing the frequency of the high power starting frequency by means of a predefined high power frequency step to a changed high power frequency;
determining the reflected high power at the changed high power frequency;
setting the changed high power frequency as the first high power frequency of the first high power frequency set if the reflected high power deceeds or comes below the high power threshold value; and wherein the step of tuning the low power starting frequency comprises the steps of:
changing the frequency of the low power starting frequency by means of a predefined low power frequency step to a changed low power frequency;
determining the reflected low power at the changed low power frequency;
setting the changed low power frequency as the first low power frequency of the first low power frequency set if the reflected low power deceeds or comes below the low power threshold value.

The high power and low power frequency step may be different. The high power and low power frequency step may be added to or subtracted from the high or low power starting frequency of the high or low power starting frequency set, the first high or low power frequency of the first high or low power starting frequency set or any other subsequent high or low power frequency of a subsequent high or low power frequency set which is used to limit the reflected power at the high or low power level. The frequency steps may be different if the frequency is increased or decreased. The frequency steps may be adapted by means of a self learning process. Alternatively, it may be possible to adapt the frequency step to reflected high or low power in relation to the high or low power threshold value. The frequency steps may, for example, decrease if the reflected high or low power may be low in order to avoid that a minimum of the reflected high or low power is passed.

The steps of changing, determining and setting may be performed within one high power pulse or low power pulse. This approach may require a relatively fast tuning procedure.

In an alternative approach it may be possible that the steps of changing, determining and setting are performed within at least two high power pulses or at least two low power pulses. It may be sufficient to perform the steps of changing, determining and setting in subsequent high power pulses or low power pulses because the impedance of the load (plasma) varies only slowly with respect to the sequences of power pulses. Furthermore, fast variations of the impedance of the load may indicate that the plasma process is unstable such that the results of the plasma process may be unsatisfactory. It may thus be counter productive to try to compensate the instability by means of fast tuning. The conditions of performing the slow tuning process may be adapted such that the slow tuning fails in case of unacceptable instabilities. The plasma process may be stopped if slow tuning in subsequent high and/or low power pulses fails.

The method may comprise the further steps of:
  determining the reflected high power at the first high power frequency of the first high power frequency set after a predefined number of high power pulses after setting the first high power frequency;
  tuning the first high power frequency of the first high power frequency set to a different second high power frequency of a second high power frequency set if the reflected high power exceeds the high power threshold value such that the reflected high power decreases below the high power threshold value;
  determining the reflected low power at the first low power frequency of the first low power frequency set after a predefined number of low power pulses after setting the first low power frequency;
  tuning the first low power frequency of the first low power frequency set to a different second low power frequency of a second low power frequency set if the reflected low power exceeds the low power threshold value such that the reflected low power decreases.

The predefined number of lower power pulses may be independent from the predefined number of high power pulses. Both processes may not influence each other.

The reasons for exceeding one of the threshold values may at least partly coincide for the high or low power pulses. The predefined number of low power pulses may therefore in an alternative approach be coupled to the predefined number of high power pulses or vice versa. The latter means that as soon as within a high power pulse or low power pulse it is detected that the high or low power threshold is exceeded the reflected power is also determined in the next low power pulse or high power pulse. Exceeding the high power threshold value triggers the determination of the reflected low power and vice versa.

The predefined number of high and/or low power pulses may be adapted such that instability of the plasma process may be detected. The predefined number of high and/or low power pulses may change but there may be a limit of a minimum number of predefined high and/or low power pulses which indicate that the impedance of the plasma varies that fast that the plasma process may be unstable if the high and/or low power threshold value are exceeded if the reflected high and/or low power is determined after the minimum number of predefined high and/or low power pulses. The plasma process may be stopped in this case. The minimum number of high and/or low power pulses may depend on the boundary conditions of the plasma process such as density of the plasma, chemical composition of the plasma and the like.

The method may further be characterized in that the high power starting frequency set comprises at least a first and a second high power starting frequency, wherein the first and the second high power starting frequency are adapted to load impedances at the high power level which are determined by the predefined high power pulse shape, and wherein the low power starting frequency set comprises at least a first and a second low power starting frequency, wherein the first and the second low power starting frequency are adapted to load impedances at the low power level which are determined by the predefined low power pulse shape. The method may comprise in this case the steps of:
  determining the reflected high power at the first or the second high power starting frequency;
  tuning the first and the second high power starting frequency to a different first and second high power frequency of a first high power frequency set if the reflected high power exceeds the high power threshold value such that the reflected high power decreases;
  determining the reflected low power at the first or the second low power starting frequency;
  tuning the first and the second high power starting frequency to a different first and second low power frequency of a first low power frequency set if the reflected low power exceeds the low power threshold value such that the reflected low power decreases.

The impedance of the plasma or load reacts in a non-linear way to changes of the provided power. Furthermore, the impedance of the plasma even changes during a square shaped pulse. The impedance is different at the beginning, in the middle and the end of such a square shaped pulse. The situation may be even more complex if other pulse shapes as square or rectangular pulse shapes may be used. It may thus be advantageous to separate the high and/or low power pulse in a number of time intervals and assign a corresponding high or low power starting frequency to the respective interval in order to minimize the reflected power at the high and low power pulse depending on the high and low power pulse shape. Using a high power and low power starting frequency sets comprising 2, 3, 4 or more high or low power starting frequencies may enable an adaption of the starting frequencies to the changing impedance during the respective high or low power pulse. The reflected power may thus be reduced during each high or low power pulse. The whole starting high or low power starting frequency set may be changed as soon as the reflected high or low power exceeds the predefined high or low power threshold value at one frequency of the respective frequency set. This procedure of adapting the frequency sets and the comprised frequencies is performed as long as the electrical generator provides energy to the plasma.

The predefined high or low power threshold value may even depend on the frequency or the assignment of the frequency to the course of the respective high or low power pulse. The predefined high or low power threshold value may, for example, be different at the beginning, in the middle or at the end of the high or low power pulse.

Using a starting frequency set with a number of starting frequencies may also be used independently from the fact that the pulse mode comprises at least a high power level and a low power level different to zero power. It may be sufficient that there is only one power level different to zero power in order to improve the adaption of the impedance of the electrical generator and the impedance of the plasma by providing a starting frequency set and subsequently adapting the frequency set in accordance with the determined reflected power as described above and below.

The measures as claimed in claims 7-12 can be realized with only one power level different to zero power and are thus independent of the features of claims 1-6. The same applies to an accordingly adapted electrical generator and plasma processing system. Further details are discussed with respect to FIGS. 7 and 10.

The reflected high and low power may be detected at more than one or even all of the frequencies of the respective frequency set within one high or low power pulse.

The time dependence of the impedance may be essentially the same for subsequent high power pulses and/or subsequent low power pulses. The reflected high power may alternatively be determined at only one of the first or the second high power starting frequency, as well as the reflected low power may be determined at only one of the first or the second low power starting frequency. Determination of the reflected power at one frequency of the respective frequency set within one power pulse may be sufficient in order limit or minimize the reflected power. The reflected high or low power may be determined within the same time interval of the high and/or low power pulse (e.g. 10 µs after starting the respective pulse). This approach may be advantageously used if certain intervals of the high and/or low power level enable a reliable detection of the reflected high and/or low power.

The method may be further characterized in that the first or the second high power starting frequency at which the reflected high power is determined is tuned differently as the other high power starting frequency such that a functional dependence of the load impedances caused by the predefined high power pulse shape is taken into account, and wherein the first or the second low power starting frequency at which the reflected low power is determined is tuned differently as the other low power starting frequency such that a functional dependence of the load impedances caused by the predefined low power pulse shape is taken into account.

The functional dependence of the impedance with respect to the time interval of the respective high and/or low power pulse may be used to provide an individual tuning of the frequencies of the respective frequency set. It may thus be possible to assign a different frequency step to the different frequencies of the frequency set.

The reflected low power may, for example, slightly exceed the low power threshold in the middle of a low power square pulse. The frequency step of the low power frequency assigned to the time interval corresponding to the middle of the low power square pulse may be small in order to deceed or come below the low power threshold. The frequency step of the low power frequency assigned to the time interval corresponding to the beginning of the low power square pulse may be bigger in view of the functional dependence of the impedance in order to deceed or come below the low power threshold.

The method may be further characterized in that after tuning the first and the second high power starting frequency to the first and the second high power frequency of the first high power frequency set based on the determination of the reflected power at one of the first and the second high power frequency of the first high power frequency set the method comprises the steps of:

determining the reflected high power at the other one of the first or the second high power frequency of the first high power frequency set after a predefined number of high power pulses;

tuning the first and the second high power frequency of the first high power frequency set to a different first and second high power frequency of a second high power frequency set if the reflected high power exceeds the high power threshold value such that the reflected high power decreases below the high power threshold; and wherein after tuning the first and the second low power starting frequency to the first and the second low power frequency of the first low power frequency set based on the determination of the reflected power at one of the first and the second low power frequency of the first low power frequency set the method comprises the steps of:

determining the reflected low power at the other one of the first or the second low power frequency of the first low power frequency set after a predefined number of low power pulses;

tuning the first and the second low power frequency of the first low power frequency set to a different first and second low power frequency of a second low power frequency set if the reflected low power exceeds the low power threshold value such that the reflected low power decreases below the high power threshold.

The frequencies of the respective frequency set are subsequently used for determination and tuning in order to avoid that there is an unacceptable mismatch at certain frequencies and assigned time intervals of high or low power pulses. This approach may be used as an alternative to the approach of determining and tuning at the same time interval of the respective high or low power pulse. It may in this case be possible to scan the time intervals at the high and/or low power level. The first determination of the reflected high power may, for example, be performed in the first time interval at the assigned first high power starting frequency at the $5^{th}$ high power pulse after starting the plasma process. The second determination of the reflected high power may, for example, be performed in the second time interval at the assigned second high power starting frequency at the $10^{th}$ high power pulse and so on. Scanning of the time intervals of the high and/or low power pulses and the respective starting frequencies or after changing the starting frequencies at the respective high and low power frequencies may enable a check whether the functional dependence of the impedance of the plasma during the high or low power level changes over time. An indication of such a change may, for example, be that the high and/or low power threshold value is more often exceeded in a defined time interval of the high and/or low power level. Such a systematic change of the functional dependence may be an indication that fundamental boundary conditions of, for example, the plasma change. This may be used to trigger an inspection of the electrical generator or a plasma processing system comprising the electrical generator and a plasma chamber.

The predefined number of high and or low power pulses may be determined by experiments or by means of a self learning algorithm which automatically increases the number of pulses if the reflected power is below the respective threshold value. As soon as the step size may be such big that the first determination shows power reflection above the threshold value the step size may be decreased by another predefined number of power pulses. This is repeated until the following determination of the reflected power is below the threshold value. This procedure is kept until the number N of power pulses within the predefined step is lower as a corresponding minimum threshold value $N_{min}$. A warning may be generated in this case that essential parameters or boundary conditions of the plasma process or the plasma processing system may have changed such that a recalibration of, for example, the functional dependence of the impedance load with respect to the applied pulse shape is recommended. The plasma processing system may even be switched off if $N_{min}$ is, for example, 1.

The method may be further characterized in that the high power starting frequency set comprises a multitude of high power starting frequencies, wherein the multitude of high power starting frequencies are adapted to load impedances at the high power level which are determined by the predefined high power pulse shape such that the number of high power starting frequencies within a predefined time interval of the predefined high power pulse is adapted to the change of the impedance load during the predefined time interval of the predefined high power pulse, and wherein the low power starting frequency set comprises a multitude of low power starting frequencies, wherein the multitude of low power starting frequencies are adapted to load impedances at the low power level which are determined by the predefined low power pulse shape such that the number of low power starting frequencies within a predefined time interval of the predefined low power pulse is adapted to the change of the impedance load during the predefined time interval of the predefined low power pulse.

The high and/or low power pulses may be divided in this case in non-equidistant time intervals. It may thus be possible to adapt the number of frequencies per time to the change of the impedance over time (dZ/dt) in order to avoid peaks in the reflected high or low power. The same approach may be applied if the high and/or low power starting frequency set are replaced by a subsequent high and/or low power frequency set.

The method may be further characterized in that a subset of high power starting frequencies is used to determine the reflected high power and to tune high power starting frequencies, and wherein a subset of low power starting frequencies is used to determine the reflected low power and to tune low power starting frequencies.

It may be advantageous to use more than one frequency of a frequency set if the frequency set comprises a multitude of frequencies. Frequencies of the frequency set which are assigned to characteristic portions of the high and/or low power frequency pulse may be used in this case. It may, for example, be possible to limit the determination and tuning to one frequency at the beginning, at the middle and the end of the high and/or low power pulse. The process may start with the frequency at the beginning which may be frequency 3 of the set which is near to the start of the pulse. The next determination and tuning process may us frequency 10 in the middle of the pulse and the next one frequency 12 at the end of the pulse. This procedure may be repeated until the plasma process is terminated. It may even be possible to subsequently change the frequency within one characteristic portion of the pulse (e.g. 2, 9 and 11). The number of frequencies used for determination and tuning within one characteristic portion of the pulse may even be different (e.g. two at the beginning of the pulse and 1 in the middle and at the end). The frequencies of the respective frequency set may be tuned as soon as the high or low power threshold value is exceeded for a predefined number (e.g. one or two) of the subset of frequencies.

It's a further object according to a second aspect of the present invention to provide an electrical generator for supplying electrical power to a plasma. Such an electrical generator may be used in a plasma process as described above.

The electrical generator comprises a control circuit and a power generator. The control circuit comprises at least one processing device, at least one memory device, at least one power measurement device and at least one frequency tuner. The control circuit is adapted to drive the power generator in a pulsed mode, the pulse mode comprises at least a high power pulse comprising a high power level and a low power pulse comprising a low power level different to zero power. The control circuit is further adapted to control the power generator such that RF-power is provided with a high power starting frequency set comprising at least one high power starting frequency at the high power pulse with the high power level with a predefined high power pulse shape. The control circuit is further adapted to control the power generator such that RF-power is provided with a low power starting frequency set comprising at least one low power starting frequency at the low power pulse with the low power level with a predefined low power pulse shape. The high power starting frequency set and the low power starting frequency set is stored in the memory device. The power measurement device is adapted to determine a reflected high power at the high power starting frequency. The power measurement device is further adapted to determine a reflected low power at the low power starting frequency. The processing device is adapted to determine whether the reflected high power exceeds a high power threshold value, and the processing device is adapted to provide high level control signals to the frequency tuner if the reflected high power exceeds a high power threshold value, wherein the frequency tuner is adapted to tune the high power starting frequency to a different first high power frequency by means of the high level control signals. The power generator is adapted to provide RF-power at the high power level at the first high power frequency such that the reflected high power decreases below the high power threshold value. The processing device is further adapted to determine whether the reflected low power exceeds a low power threshold value, and the processing device is adapted to provide low level control signals to the frequency tuner if the reflected low power exceeds a low power threshold value, wherein the frequency tuner is adapted to tune the low power starting frequency to a different first low power frequency by means of the low level control signals. The power generator is further adapted to provide RF-power at the low power level at the first low power frequency such that the reflected low power decreases below the low power threshold value.

The control unit and the power generator may be separately realized by specialized circuit arrangements or alternative one common integrated circuit arrangement. The control circuit may be a closed arrangement in which the functionalities of the processing device, memory device, power measurement device and frequency tuner are realized by shared components. Alternatively, the control circuit may be a distributed arrangement in which the functionalities of the processing device, memory device, power measurement device and frequency tuner are realized by different modules interacting by means of accordingly adapted interfaces. The memory device may comprise one or more memory modules or sub modules. The processing device may comprise one or more processors or microprocessors.

The electrical generator may be comprised by a plasma processing system which further comprises a plasma chamber. The plasma is generated in the plasma chamber which comprises supply devices for providing the chemical components and the physical boundary conditions to enable a stable plasma process. The plasma processing system may comprise a matching circuit which may simplify impedance match of the electrical generator and the plasma chamber.

It's another object according to a third aspect of the present invention to provide an improved computer program product comprising code means which can be saved on at least one operating memory device of the electrical generator according to claim 13, wherein the code means being arranged such that the method according to any one of the claims 1 to 12 can be executed by means of the operating processing device of the electrical generator according to claim 13. The operating memory device or the operating processing device may identical with or different from the memory device or the processing device.

It shall be understood that the method of claim 1-12, the electrical generator of claim 13 and the computer program product of claim 15 have similar and/or identical embodiments, in particular, as defined in the dependent claims.

The method, the electrical generator, the plasma processing system and the computer program product may have the advantage that the stability of the plasma with respect to repeated and essentially identical high and low power pulses is used to reduce the controlling effort and to check the stability of the plasma process.

It shall be understood that a preferred embodiment of the invention can also be any combination of the dependent claims with the respective independent claim.

Further advantageous embodiments are defined below.

BRIEF DESCRIPTION OF THE DRAWINGS

These and other aspects of the invention will be apparent from and elucidated with reference to the embodiments described hereinafter.

The invention will now be described, by way of example, based on embodiments with reference to the accompanying drawings.

In the drawings:

FIG. 1 shows a principal sketch of an embodiment of an electrical generator

FIG. 2 shows a principal sketch of an embodiment of a plasma processing system

FIG. 3 shows a principal sketch of a first embodiment of a pulse sequence with a high and low power level FIG. 4 shows a principal sketch of a functional dependence of the impedance of the plasma caused by the pulse sequence shown in FIG. 3

FIG. 5 shows a principal sketch of a high and low power starting frequency set mapped to the pulse sequence of FIG. 3

FIG. 6 shows a principal sketch of a high and low power starting frequency set mapped to the functional dependence of FIG. 4

Figure 7:
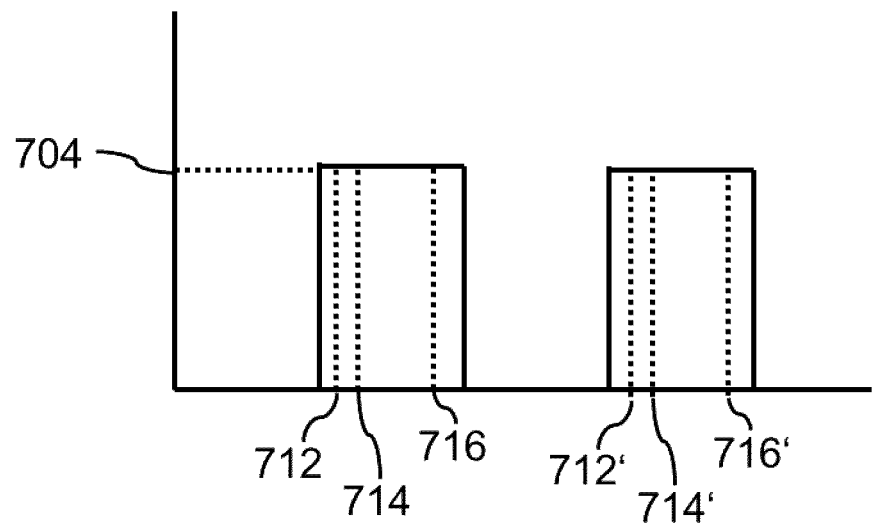
Figure 8:
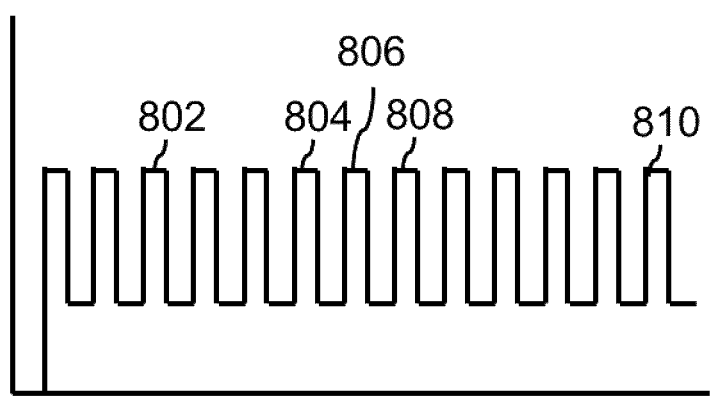
Figure 9:
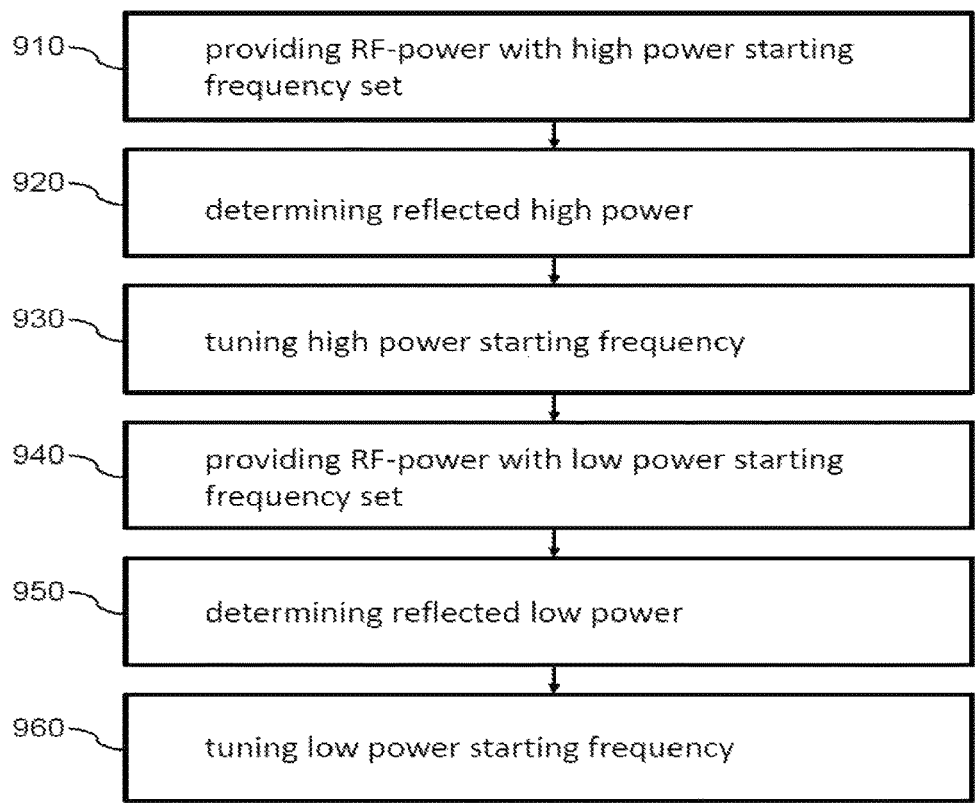
Figure 10:
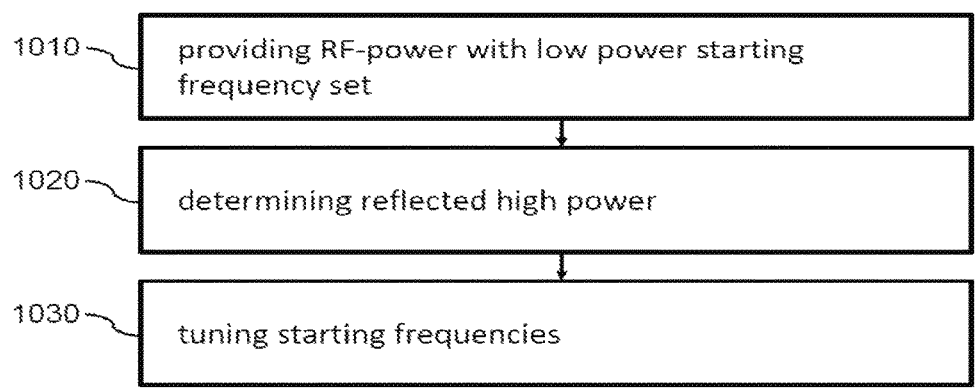

FIG. 7 shows a principal sketch of a high power frequency set mapped to another pulse sequence FIG. 8 shows a principal sketch of a tuning procedure during a pulse sequence FIG. 9 shows a principal sketch of a first method of frequency tuning FIG. 10 shows a principal sketch of a second method of frequency tuning In the Figures, like numbers refer to like objects throughout. Objects in the Figures are not necessarily drawn to scale.

DETAILED DESCRIPTION OF EMBODIMENTS

Various embodiments of the invention will now be described by means of the Figures.

Figure 1:
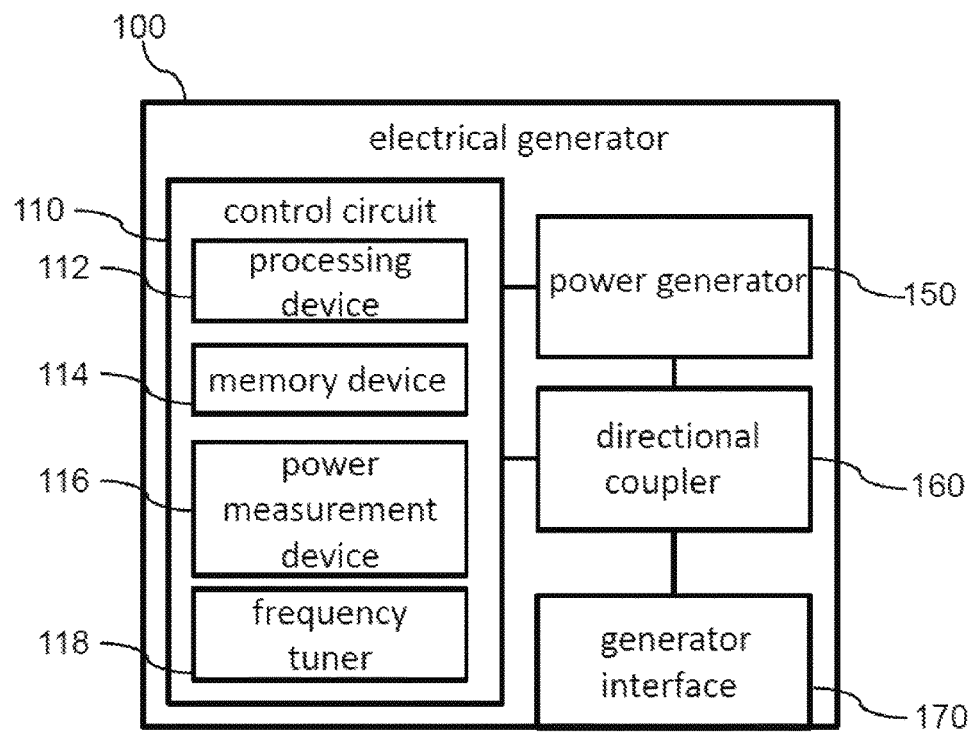

FIG. 1 shows a principal sketch of an embodiment of an electrical generator 100. The electrical generator 100 comprises a control circuit 110 for controlling a power generator 150 for providing RF-power to a plasma chamber 220 shown in FIG. 2 via a generator interface 170.

The power generator 150 can provide RF-power at different RF-frequencies in the range from 0.1-200 MHz. The power generator 150 may comprise one or more sub-generators being adapted to provide RF-power in defined frequency ranges (e.g. one sub generator at 2 MHz and another sub generator with a variable frequency for providing RF-power in the frequency range between 95 MHz-105 MHz). The control circuit 110 comprises a processing device 112 (one or more processors or micro-processors), a memory device 114 (RAM, SSD, disc drive, optical storage device or the like), a power measurement device 116 for measuring forward power and reflected power and a frequency tuner 118 for changing the frequency of the RF-power in order to minimize the reflected power which may damage the power generator 100.

Forward power is power which is intended to be transferred from the power generator 150 to the plasma chamber 220 and generated by the power generator 150 and reflected power is power which is reflected due to an impedance mismatch between the electrical generator and the plasma chamber 220.

The control circuit 110 and especially the power measurement device 116 receives information regarding the forward power and reflected power by means of a directional coupler 160 which is arranged between the power generator 150 and the generator interface 170. The power measurement device 116 determines the reflected power and the forward power or the ratio of the reflected and the forward power and transfers this information to the processing device 112. This ratio depends on the actual power level and the frequency at which the RF-power is provided because the impedance of the plasma depends (besides other factors like the pressure and chemical composition and the like) on this frequency. The processing device 112 uses the information provided by the power measurement device 116 in order to determine whether the reflected power or the ratio between reflected power and forward power exceeds a threshold value or not. The processing device 112 generates control signals as soon as the reflected power exceeds the threshold value. The control signals are transferred to the frequency tuner 118 which changes the frequency at which the power generator 150 provides the RF-power to the plasma. The power measurement device 116 measures the reflected power at the changed frequency. The control circuit 110 further determines whether the reflected power decreased or increased in reaction of the changed frequency and generates further control signals if the reflected power still exceeds the threshold value. These control signals trigger a further change of the frequency of the power generator 150 wherein the control signals further trigger the direction of the frequency change. The direction of frequency change (e.g. change to lower frequencies) is kept if the reduction of the frequency resulted in decreasing reflected power. The direction of frequency change is changed if the reduction of the frequency resulted in increasing reflected power. This procedure is repeated until the reflected power is lower than the threshold value. The changed frequency at which the reflected power is lower than the threshold value is kept until the impedance of the plasma changes again such that the reflected power exceeds the threshold value triggering a new tuning loop as described above. The frequency at which the RF-power is provided is therefore an important control parameter in order to limit reflected power.

Figure 2:
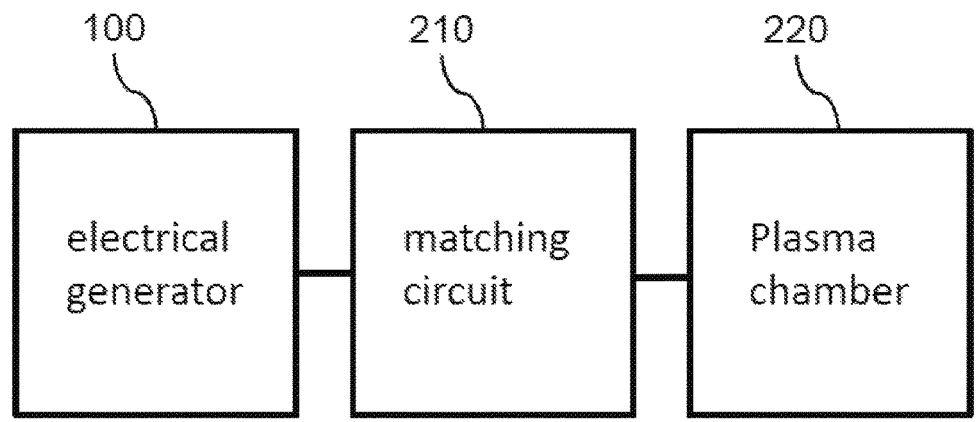

FIG. 2 shows a principal sketch of an embodiment of a plasma processing system which comprises besides the electrical generator 100 and the plasma chamber 220 a matching circuit 210 which is arranged between the electrical generator 100 and the plasma chamber 220. The matching circuit 210 transforms the impedance of the electrical generator 100 to the impedance of the load, the plasma in the plasma chamber 220. The matching circuit 210 simplifies impedance match between the electrical generator 100 and the plasma. This impedance match is best at a defined frequency at a defined impedance of the electrical generator 100 and a defined impedance of the plasma. The reflected power thus increases as soon as the impedance of the plasma changes. One option to minimize reflected would be a tunable matching circuit which may comprise, for example, tunable capacitors.

The impedance of the plasma further depends on the pulse shape used to provide the RF-power as discussed in detail with respect to FIGS. 3 to 6. Driving the plasma in a pulse mode makes impedance match difficult because the impedance changes quickly depending on the pulse such that tunable matching circuits may be to slow. The most important control parameter in order to limit reflected power is in this case the frequency at which the RF-power is provided because the frequency can be tuned much quicker as tunable matching circuits.

Figure 3:
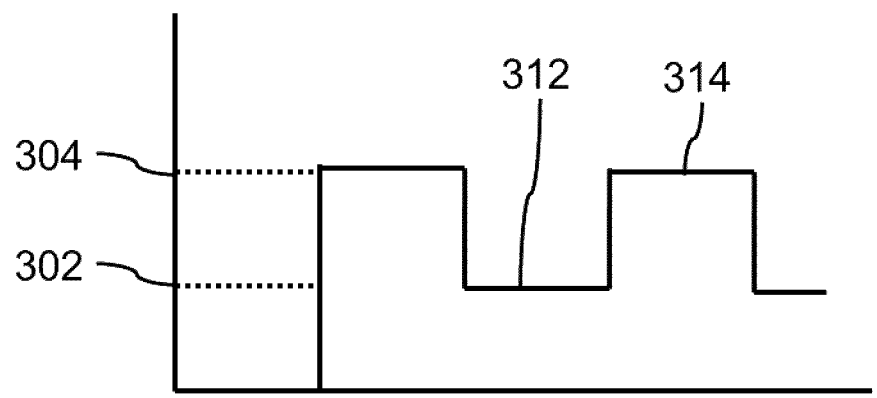
Figure 4:
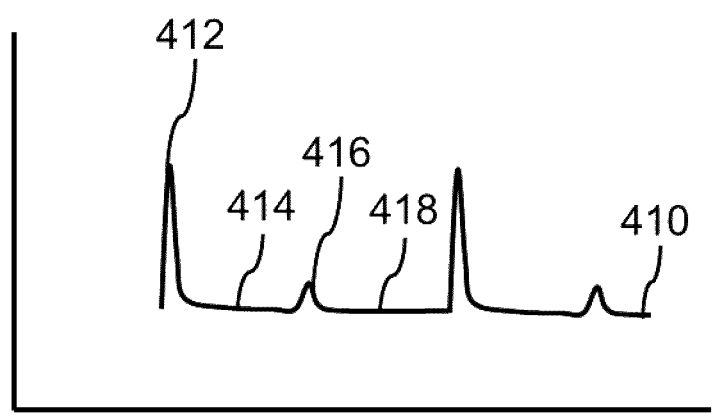
Figure 5:
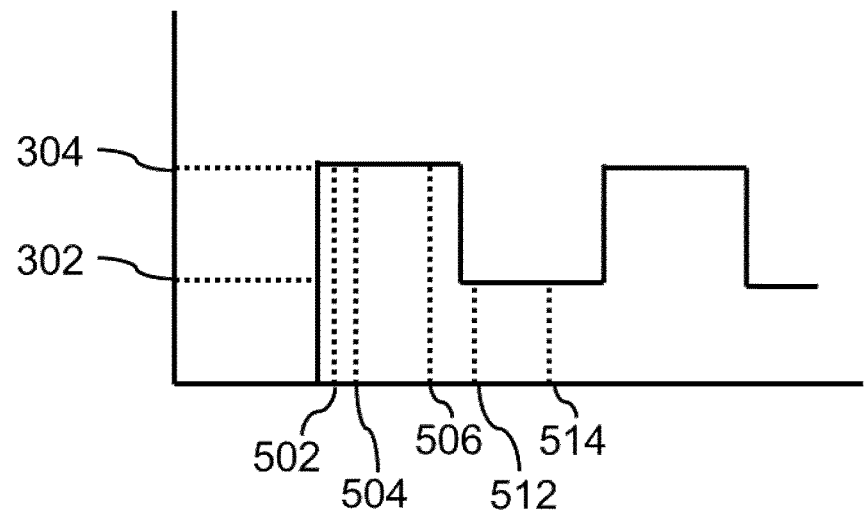
Figure 6:
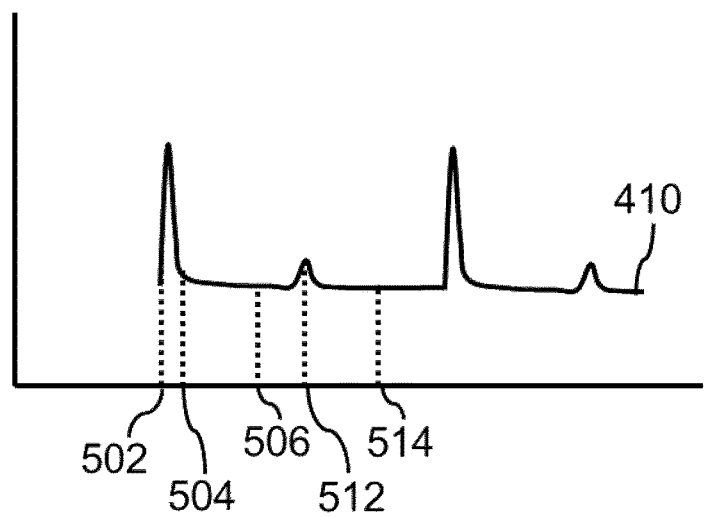

The control circuit 110 controls the power generator to provide the RF-power after an ignition phase at which the power is provided at an essentially constant power level in a pulse mode. The pulse mode comprises a high power level 304 and a low power level 302. An example of such a pulse mode is shown in FIG. 3 which shows rectangular high power pulses 314 and low power pulses 312. The pulse mode shown in FIG. 3 corresponds to an impedance variation of the plasma which is schematically shown in FIG. 4. The impedance variation comprises an impedance peak 412 at the beginning of a high power pulse 314, a relative constant impedance 414 at the middle of the high power pulse 314, a smaller impedance peak 416 at the beginning of a low power pulse 312 followed by a relative constant impedance 418 at the middle of the low power pulse 312. It has been observed that the impedance varies along the repeating high and low power pulses 314, 312 only slowly as long as the pulse shape and amplitude is kept and the plasma conditions are essentially constant (e.g. pressure). Furthermore, it has been observed that high and low power starting frequency sets can be used after ignition of the plasma in order to limit the reflected power. The high power starting frequency set comprises in this case three high power starting frequencies 502, 504 and 506 which are adapted to the functional dependence of the impedance variation of the plasma at high power pulses 314 shortly after ignition of the plasma as shown in FIGS. 5 and 6. The first high power starting frequency at which the power generator provides forward power is adapted to provide low reflected power at the beginning of the high power pulse 314. The second high power starting frequency 504 at which the power generator provides forward power is adapted to provide low reflected power shortly after the impedance deviation maximum (the impedance may be lower or higher than the impedeance of the power generator) at the beginning of the high power pulse 314. The third high power starting frequency 506 at which the power generator provides forward power is adapted to provide low reflected power when the impedance remains essentially constant some µs after starting the high power pulse 314. The same approach is used at the lower power pulse 312 in which a low power starting frequency set is used comprising two low power starting frequencies 512 and 514 in order to minimize or at least limit reflected power at the low power level 302. The time intervals with respect to, for example, the high power pulse 314 at which the high power starting frequencies 502, 504 and 506 are provided are not equidistant but at characteristic portions of the impedance function. The frequencies are assigned to fixed points in times with respect to the start of the high or low power pulse 314, 312. More high power starting frequencies and low power starting frequencies may help to further reduce the reflected power shortly after ignition of the plasma.

The high power starting frequencies 502, 504 and 506 and the low power starting frequencies 512, 514 are stored in the memory device 114 and transferred to the frequency tuner 118 such that the power generator provides the forward power at the starting frequency at the assigned point in time of the high or low power pulse 314, 312.

The functional dependence of the plasma changes slowly with each high and low power pulse 314, 312 until the reflected high power meaning the power reflected at the high power level 304 during the high power pulse 314 exceeds a high power threshold or until the reflected low power meaning the power reflected at the low power level 302 during the low power pulse 312 exceeds a low power threshold. The high power starting frequencies 502, 504 and 506 and/or the low power starting frequencies 512, 514 have to be tuned in this case as generally described above in FIG. 1 and the corresponding description.

FIG. 8 shows a principal sketch of a tuning procedure during a pulse sequence as described in FIGS. 3 to 6. The discussion is based on measures at the high power level or high power pulses but is also applicable to the low power level or low power pulses. It should be clarified in this respect that high or low power level and high and low power pulse seem to be the same in case of rectangular pulse shapes. A high power pulse may in case of non-rectangular high power pulse shape comprise a multitude of high power levels. An example may be a ramp of increasing power within a high power pulse. It may even be that the some of the high power levels are lower than low power levels of the corresponding low power pulse (e.g. high and low power pulses comprising ramps with different slopes).

The electrical generator 100 provides RF-power after ignition of the plasma within high power pulses with a high power starting frequency set comprising six high power starting frequencies which are equidistantly distributed across the high power pulses. The power is provided at the first high power starting frequency within the first 20 µs of the high power pulse, at the second high power starting frequency within the second 20 µs of the high power pulse and so on. The high power staring frequencies of the high power starting frequency set are stored in the memory device 114 of control circuit 110 of the electrical generator 100.

The reflected high power is determined the first time at the third high power pulse 802 after ignition of the plasma. The reflected high power is measured at the first high power starting frequency of the high power starting frequency set and below the high power threshold value such that the high power starting frequencies are used for the next three high power pulses. The reflected high power is determined the second time at the sixth high power pulse 804 after ignition of the plasma. The reflected high power is measured at the second high power starting frequency of the high power starting frequency set and exceeds the high power threshold value. The impedance of the time varying load (plasma) changed such that the reflected high power exceeds the high power threshold value. The frequencies of the high power starting frequency set are individually tuned by adding an individual fraction of a frequency step Δf to the respective high power starting frequency. The fraction of the frequency step Δf is adapted to the expected change of the impedance of the load at the respective points in time of the high power pulse to which the frequencies of the frequency set are assigned. The full frequency step is added to the first and second high power starting frequency, three quarter of the frequency step is added to the third high power starting frequency and halve of the frequency step is added to the fourth, fifth and sixth high power starting frequency. The tuned high power frequencies of a tuned high power frequency set are applied in the seventh high power pulse 806 and the reflected high power is measured at the point in time of the seventh high power pulse 806 which is assigned to the third tuned high power frequency. The reflected high power still exceeds the high power threshold value and exceeds even the previous measurement value. The tuning and determination process is repeated in the eight high power pulse 808 wherein the frequencies are tuned by subtracting 2 times the fraction of Δf which was added to the respective frequencies of the high power frequency set in the previous seventh high power pulse 806. The multiplication factor or Δf may in a more sophisticated approach even be adapted to the determined reflected high power.

The reflected high power is measured at the point in time of the eight high power pulse 808 which is assigned to the fourth tuned high power frequency and is near to zero and thus far below the high power threshold value. The tuned high power frequencies are set as first high power frequency set. The time interval to the next determination is increased in view of the determined reflected high power such that the reflected high power is measured the next time at the thirteenth high power pulse 810. The reflected high power is determined at the point in time of the thirteenth high power pulse 810 which is assigned to the fifth high power frequency of the first high power frequency set. The procedure is repeated in the subsequent high power pulses whereby each time the next frequency of the respective high power frequency set is used until the sixth one is reached and it is started again with the first one.

It may be preferred in case that one or more points in time of the high or low power pulses may be more sensitive with respect to changes of the impedance of the load that only the frequencies are used for determining the reflected high or low power which are assigned to the respective points in time in order to improve the sensitivity of the tuning process.

FIG. 9 shows a principal sketch of a first method of frequency tuning according to the present invention. RF-power is provided in step 910 at a high power pulse with a high power starting frequency set. In step 920 it is determined whether the reflected high power exceeds the high power threshold value. The one or more high power starting frequencies of the high power starting frequency set are tuned in step 930 as long as the reflected high power deceeds the high power threshold value. Furthermore, RF-power is provided in step 940 at a low power pulse with a low power starting frequency set. In step 950 it is determined whether the reflected low power exceeds the low power threshold value. The one or more low power starting frequencies of the low power starting frequency set are tuned in step 960 as long as the reflected low power deceeds the low power threshold value.

FIG. 7 shows a principal sketch of a high power frequency set mapped to another pulse sequence. The pulse mode described in FIG. 7 is not within the scope of the claims. FIG. 7 demonstrates that the approach of dividing each pulse in a number of time steps and assigning corresponding frequencies to the time steps in order to match the impedance of an electrical generator 100 to the time variation of the load impedance during a power pulse can also be used if there is only one high power level 704. There are in this case rectangular power pulses which are separated by time phases at which no power is provided to the plasma. FIG. 7 shows an intermediate phase of the pulse sequence at which the frequencies of a high power starting frequency set were already tuned to a first high power frequency set comprising a first, a second and a third high power frequencies 712, 714, 716 applied in a power pulse. These frequencies are tuned in a subsequent power pulse to tuned first, second and third high power frequencies 712', 714', 716' because the reflected power was determined at all three frequencies 712, 714, 716 and in all case above a defined threshold value. The procedure is if necessary repeated in subsequent power pulses until the reflected power is below the threshold value at all three frequencies.

FIG. 10 shows a principal sketch of a second method of frequency tuning which is not within the scope of the claims. The method described in FIG. 10 may be applied to a pulse mode as described with respect to FIG. 7. RF-power is provided in step 1010 at a power pulse with a starting frequency set. The starting frequency set comprises one or more starting frequencies which are stored in a memory device 114 as discussed with respect to FIG. 1. In step 1020 it is determined whether the reflected power exceeds a threshold value. The one or more starting frequencies of the starting frequency set are tuned in step 1030 as long as the reflected power deceeds the threshold value.

It's the idea of the present invention to provide a method of frequency tuning a time varying load as, for example, a plasma which is driven by RF-power in a pulse mode. The impedance variations of the time varying load are preferably such that the time dependence of the impedance across one pulse is nearly unchanged at the subsequent pulse. The method may be used to control an electrical generator to drive such a time varying load. The electrical generator and the time varying load may build a system.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

LIST OF REFERENCE NUMERALS 100 electrical generator
110 control circuit
112 processing device
114 memory device
116 power measurement device
118 frequency tuner
150 power generator
160 directional coupler
170 generator interface
210 matching circuit
220 plasma chamber
302 low power level
304 high power level
312 low power pulse
314 high power pulse
410 impedance of plasma
412 impedance peak at the beginning of a high power pulse
414 impedance at the middle of a high power pulse
416 impedance peak at the beginning of a low power pulse
418 impedance at the middle of a low power pulse
502 first high power starting frequency of first high power starting frequency set
504 second high power starting frequency of first high power starting frequency set
506 third high power starting frequency of first high power starting frequency set
512 first low power starting frequency of first low power starting frequency set
514 second low power starting frequency of first low power starting frequency set
704 high power level
712 first high power frequency of first high power frequency set
714 second high power frequency of first high power frequency set
716 third high power frequency of first high power frequency set
712' tuned first high power frequency of first high power frequency set
714' tuned second high power frequency of first high power frequency set
716' tuned third high power frequency of first high power frequency set
802 third high power pulse
804 sixth high power pulse
806 seventh high power pulse
808 eight high power pulse
810 thirteenth high power pulse
910 providing RF-power with high power starting frequency set
920 determining reflected high power
930 tuning high power starting frequency
940 providing RF-power with low power starting frequency set
950 determining reflected low power
960 tuning low power starting frequency
1010 providing RF-power with low power starting frequency set
1020 determining reflected high power
1030 tuning starting frequencies

The invention claimed is:

1. A method of frequency tuning an electrical generator for supplying electrical power to a plasma, wherein the method comprises a pulsed mode, the pulse mode comprising at least a high power pulse comprising a high power level and a low power pulse comprising a low power level different to zero power, the method comprising the steps of:
   providing an RF-power with a high power starting frequency set comprising at least one high power starting frequency at the high power pulse with a predefined high power pulse shape;
   providing an RF-power with a low power starting frequency set comprising at least one low power starting frequency at the low power pulse with a predefined low power pulse shape;
   determining a reflected high power at the high power starting frequency;
   tuning the high power starting frequency to a different first high power frequency if the reflected high power exceeds a high power threshold value such that the reflected high power decreases below the high power threshold value;
   determining a reflected low power at the low power starting frequency;
   tuning the low power starting frequency to a different first low power frequency if the reflected low power exceeds a low power threshold value such that the reflected low power decreases below the low power threshold value.

2. The method according to claim 1, further comprising the steps of:
   determining the reflected high power at a first high power pulse;
   repeating determining the reflected high power at a subsequent high power pulse until the reflected high power exceeds the high power threshold value, wherein subsequent determinations of the reflected high power are performed at different high power pulses;
   tuning the high power starting frequency if the reflected high power exceeds the high power threshold value;
   determining the reflected low power at a first low power pulse;
   repeating determining the reflected low power at a subsequent low power pulse until the reflected low power exceeds the low power threshold value, wherein subsequent determinations of the reflected low power are performed at different low power pulses;
   tuning the low power starting frequency if the reflected low power exceeds the low power threshold value.

3. The method according to claim 1, wherein the step of tuning the high power starting frequency comprises the steps of:
   changing the frequency of the high power starting frequency by means of a predefined high power frequency step to a changed high power frequency;
   determining the reflected high power at the changed high power frequency;
   setting the changed high power frequency as the first high power frequency if the reflected high power goes down below the high power threshold value; and wherein the step of tuning the low power starting frequency comprises the steps of:
   changing the frequency of the low power starting frequency by means of a predefined low power frequency step to a changed low power frequency;
   determining the reflected low power at the changed low power frequency;
   setting the changed low power frequency as the first low power frequency if the reflected low power goes down below the low power threshold value.

4. The method according to claim 3, wherein the steps of changing, determining and setting are performed within one high power pulse or low power pulse.

5. The method according to claim 4, further comprising the steps of:
determining the reflected high power at the first high power frequency after a predefined number of high power pulses after setting the first high power frequency;
tuning the first high power frequency to a different second high power frequency if the reflected high power exceeds the high power threshold value such that the reflected high power decreases below the high power threshold value;
determining the reflected low power at the first low power frequency after a predefined number of low power pulses after setting the first low power frequency;
tuning the first low power frequency to a different second low power frequency if the reflected low power exceeds the low power threshold value such that the reflected low power decreases.

6. The method according to claim 3, wherein the steps of changing, determining and setting are performed within at least two high power pulses or at least two low power pulses.

7. The method according to claim 1, wherein the high power starting frequency set comprises at least a first and a second high power starting frequency wherein the first and the second high power starting frequency are adapted to load impedances at the high power level which are determined by the predefined high power pulse shape, and wherein the low power starting frequency set comprises at least a first and a second low power starting frequency wherein the first and the second low power starting frequency are adapted to load impedances at the low power level which are determined by the predefined low power pulse shape, wherein the method comprises the steps of:
determining the reflected high power at the first or the second high power starting frequency;
tuning the first and the second high power starting frequency to a different first and second high power frequency of a first high power frequency set if the reflected high power exceeds the high power threshold value such that the reflected high power decreases;
determining the reflected low power at the first or the second low power starting frequency;
tuning the first and the second high power starting frequency to a different first and second low power frequency of a first low power frequency set if the reflected low power exceeds the low power threshold value such that the reflected low power decreases.

8. The method according to claim 7, wherein the reflected high power is determined at only one of the first or the second high power starting frequency, and wherein the reflected low power is determined at only one of the first or the second low power starting frequency.

9. The method according to claim 8, wherein after tuning the first and the second high power starting frequency to the first and the second high power frequency of the first high power frequency set based on the determination of the reflected power at one of the first and the second high power frequency of the first high power frequency set; the method further comprises the steps of:
determining the reflected high power at the other one of the first or the second high power frequency of the first high power frequency set after a predefined number of high power pulses;
tuning the first and the second high power frequency of the first high power frequency set to a different first and second high power frequency of a second high power frequency set if the reflected high power exceeds the high power threshold value such that the reflected high power decreases below the high power threshold; and
wherein after tuning the first and the second low power starting frequency to the first and the second low power frequency of the first low power frequency set based on the determination of the reflected power at one of the first and the second low power frequency of the first low power frequency set the method further comprises the steps of:
determining the reflected low power at the other one of the first or the second low power frequency of the first low power frequency set after a predefined number of low power pulses;
tuning the first and the second low power frequency of the first low power frequency set to a different first and second low power frequency of a second low power frequency set if the reflected low power exceeds the low power threshold value such that the reflected low power decreases below the high power threshold.

10. The method according to claim 7, wherein the first or the second high power starting frequency at which the reflected high power is determined is tuned differently as the other high power starting frequency such that a functional dependence of the load impedances caused by the predefined high power pulse shape is taken into account, and wherein the first or the second low power starting frequency at which the reflected low power is determined is tuned differently as the other low power starting frequency such that a functional dependence of the load impedances caused by the predefined low power pulse shape is taken into account.

11. The method according to claim 7, wherein the high power starting frequency set comprises a multitude of high power starting frequencies, wherein the multitude of high power starting frequencies are adapted to load impedances at the high power level which are determined by the predefined high power pulse shape such that the number of high power starting frequencies within a predefined time interval of the high power pulse is adapted to the change of the impedance load during the predefined time interval of the high power pulse, and wherein the low power starting frequency set comprises a multitude of low power starting frequencies, wherein the multitude of low power starting frequencies are adapted to load impedances at the low power level which are determined by the predefined low power pulse shape such that the number of low power starting frequencies within a predefined time interval of the low power pulse is adapted to the change of the impedance load during the time interval of the predefined low power pulse.

12. The method according to claim 11, wherein a subset of the multitude of high power starting frequencies is used to determine the reflected high power and to tune high power starting frequencies, and wherein a subset of the multitude of low power starting frequencies is used to determine the reflected low power and to tune low power starting frequencies.

13. An electrical generator for supplying electrical power to a plasma, the electrical generator comprising a control circuit and a power generator, the control circuit comprising at least one processing device, at least one memory device, at least one power measurement device and at least one frequency tuner, wherein the control circuit is adapted to drive the power generator in a pulsed mode, the pulsed mode comprises at least a high power pulse comprising a high power level and a low power pulse comprising a low power level different to zero power, the control circuit is further adapted to control the power generator such that RF-power is provided with a high power starting frequency set comprising at least one high power starting frequency at the high power pulse with a predefined high power pulse shape, and the control circuit is further adapted to control the power generator such that RF-power is provided with a low power starting frequency set comprising at least one low power starting frequency at the low power pulse with a predefined low power pulse shape, the high power starting frequency set and the low power starting frequency set being stored in the at least one memory device, the power measurement device being adapted to determine a reflected high power at the high power starting frequency, and the power measurement device being adapted to determine a reflected low power at the low power starting frequency, the at least one processing device being adapted to determine whether the reflected high power exceeds a high power threshold value, and the processing device being adapted to provide high level control signals to the frequency tuner if the reflected high power exceeds a high power threshold value, wherein the frequency tuner being adapted to tune the high power starting frequency to a different first high power frequency by means of the high level control signals, and the power generator being adapted to provide RF-power at the high power level at the first high power frequency such that the reflected high power decreases below the high power threshold value, and the at least one processing device being adapted to determine whether the reflected low power exceeds a low power threshold value, and the processing device being adapted to provide low level control signals to the frequency tuner if the reflected low power exceeds a low power threshold value, wherein the frequency tuner being adapted to tune the low power starting frequency to a different first low power frequency by means of the low level control signals, and the power generator being adapted to provide RF-power at the low power level at the first low power frequency such that the reflected low power decreases below the low power threshold value.

14. A plasma processing system comprising the electrical generator of claim 13 and a plasma chamber.

15. A computer program product comprising executable code which is saved on the at least one memory device of the electrical generator according to claim 13, the executable code when executed by the at least one processing device to allow the at least one processing device to determine whether the reflected low power exceeds a low power threshold value, and the at least one processing device being adapted to provide low level control signals to the frequency tuner if the reflected low power exceeds a low power threshold value, wherein the frequency tuner being adapted to tune the low power starting frequency to a different first low power frequency by means of the low level control signals, and the power generator being adapted to provide RF-power at the low power level at the first low power frequency such that the reflected low power decreases below the low power threshold value.

* * * * *